United States Patent [19]
Embree et al.

[11] Patent Number: 6,013,934
[45] Date of Patent: Jan. 11, 2000

[54] SEMICONDUCTOR STRUCTURE FOR THERMAL SHUTDOWN PROTECTION

[75] Inventors: Milton Luther Embree, Reading; Muhammed Ayman Shibib, Wyomissing, both of Pa.

[73] Assignee: Lucent Technologies Inc., Murray Hill, N.J.

[21] Appl. No.: 08/819,828

[22] Filed: Mar. 18, 1997

[51] Int. Cl.[7] ................................. H02H 9/02
[52] U.S. Cl. .................. 257/467; 257/290; 257/293; 257/444; 257/458; 257/226; 257/359; 257/406; 257/470; 257/380
[58] Field of Search ..................... 257/226, 233, 257/236, 234, 239, 257, 290, 293, 444, 458, 467–470, 380, 379, 359, 406, 570, 572, 577, 580, 581, 582

[56] References Cited

U.S. PATENT DOCUMENTS

| | | |
|---|---|---|
| 5,025,298 | 6/1991 | Fay et al. ................................. 257/470 |
| 5,027,251 | 6/1991 | Hirota et al. ............................ 257/356 |
| 5,087,956 | 2/1992 | Ikeda et al. ............................. 257/380 |
| 5,502,338 | 3/1996 | Suda et al. .............................. 257/570 |
| 5,594,269 | 1/1997 | Spinner, III et al. ................... 257/380 |
| 5,726,481 | 3/1998 | Moody .................................... 257/470 |

FOREIGN PATENT DOCUMENTS

| | | | |
|---|---|---|---|
| 360154560 | 8/1985 | Japan ..................................... 257/581 |
| 363150964 | 6/1988 | Japan ..................................... 257/406 |

*Primary Examiner*—Fetsum Abraham
*Attorney, Agent, or Firm*—Gibbons, Del Deo, Dolan, Griffinger & Vecchione

[57] ABSTRACT

A semiconductor structure having a temperature sensor placed in close proximity to gate and source and/or drain electrodes. The sensor is compatible with conventional semiconductor processing and is typically made from doped polysilicon having a large temperature coefficient of resistivity. At least one sensor may be placed under, but insulated from, source or drain electrodes to protect against high electric fields. The sensor is also compatible with bipolar semiconductor structures.

22 Claims, 7 Drawing Sheets

SEMICONDUCTOR STRUCTURE FOR THERMAL SHUTDOWN PROTECTION

CROSS REFERENCE TO RELATED APPLICATION

This application is related to another U.S. patent application, having a filing date of Feb. 10, 1997, and Ser. No. 08/797,149, U.S. Pat. No. 5,838,187 entitled "Integrated Circuit Thermal Shutdown System Utilizing a Thermal Sensor", (Embree 34) having one common inventor and a common assignee.

BACKGROUND OF THE INVENTION

1. Field of the Invention

This invention relates to the detection of temperature within a semiconductor, and, more particularly, to a structure having a sensor located in close proximity to the source and/or drain electrodes of an MOS transistor or to the emitter and/or collector electrodes of a bipolar transistor.

2. Description of Related Art

Advances in the art of semiconductor processing have increased the density of components on a chip and the power that they deliver. Although package designs attempt to dissipate heat away from the chip, there are conditions where it is necessary to know the temperature of critical elements on a semiconductor chip to ensure performance within design parameters or to prevent physical damage to the semiconductor structure itself.

This is particularly important when a fault condition such as an output short circuit condition is encountered. The problem is aggravated in high voltage dielectrically isolated circuits where the heat generating devices are located in individual tubs formed by a few microns of silicon dioxide which are under and around a device. Silicon dioxide is an excellent dielectric material, but its thermal resistivity is about 100 times that of silicon, so it interferes with dissipating heat to a heat sink on the back of the chip.

Attempts have been made to integrate thermal sensors on the chip. These are typically a diode or bipolar transistor located next to the heat generating device. The thermal sensor interacts with a shutdown circuit which makes a comparison to a reference voltage and shuts down the power if a limit is exceeded.

The problem with the structure above is that there is a temperature gradient along the chip from this heat generating device to the sensor. This gradient is precipitously increased if a dielectric isolation tub is encountered on the way to the sensor. Therefore, the sensor detects a temperature which may be significantly lower than that of the actual device. Similarly, there is a temporal lag between the onset of a fault condition and the detection of increased temperature by the sensor located nearby the device.

Accordingly, there is a need in the art for a semiconductor structure which reacts faster to thermal overload conditions and which more accurately detects the maximum temperature generated by the device.

SUMMARY OF THE INVENTION

The present invention relates to a semiconductor structure which integrates a sensor within a transistor structure.

In one embodiment of the invention, a sensor is located between the gate and the drain electrodes of a transistor. The sensor is dielectrically isolated from the source, gate, and drain electrodes and it is connected to a temperature sensing circuit. In an exemplary embodiment, the sensor is a doped polysilicon resistor which has a large temperature coefficient of resistivity which makes it very sensitive to temperature change. The conductors which connect the sensor to a temperature sensing circuit are metal or polysilicon which is doped like the source, gate, and drain electrodes.

In another embodiment of the invention, the source electrode is extended over, but insulated from, the gate electrode and the sensor. This structure shields the gate and sensor from large potential swings at the drain in high voltage circuits.

In yet another embodiment of the invention, the drain electrode is extended over, but insulated from the sensor. In this configuration the sensor is biased near the potential of the drain electrode.

In still another embodiment of the invention, a first sensor is located under, but insulated from, the source electrode; and a second sensor is located under, but insulated from, the drain electrode.

In a further embodiment of the invention, a sensor is supported by a thin oxide over a drain contact region.

In yet a further embodiment of the invention, at least one sensor is employed in a bipolar semiconductor structure.

In still a further embodiment of the invention, at least one sensor is employed in a bipolar semiconductor structure having a single insulator.

The advantages of locating at least one sensor near the source and/or drain electrode of a transistor are that the transistor temperature can be most accurately and quickly determined. This is because the sensor is within the transistor structure with a minimum distance to the source of heat generation. The sensor materials are also compatible with semiconductor fabrication.

The embodiments provide features and advantages of the invention which will be better understood with consideration of the following detailed description of the preferred embodiments taken in conjunction with the accompanying drawings.

BRIEF DESCRIPTION OF THE DRAWINGS

FIG. 1[B] is a sectional view of one embodiment of the invention;

The drawings are not to scale.

DETAILED DESCRIPTION OF THE PREFERRED EMBODIMENTS

Figure 1A:
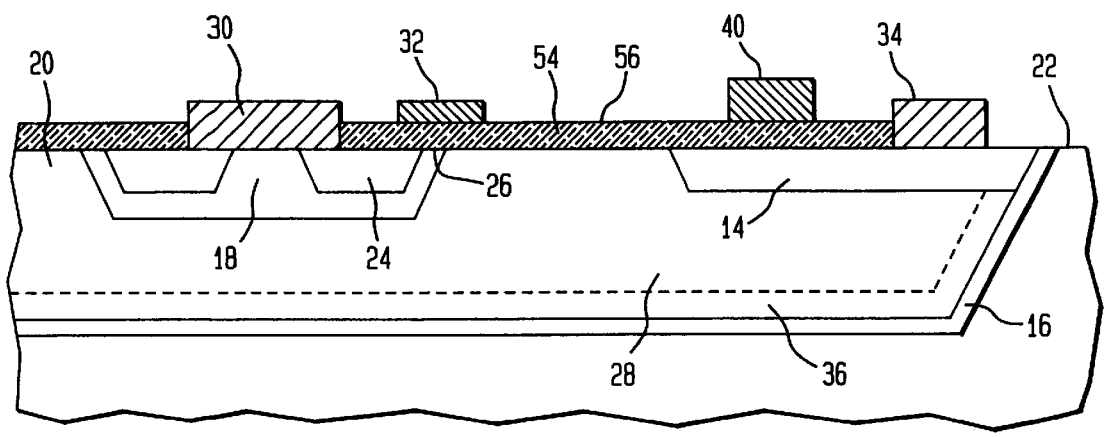
FIG. 1[A] is a sectional view of one embodiment of the invention.

Referring now to FIG. 1A, there is shown semiconductor structure 100, in accordance with one embodiment of the invention, wherein semiconductor 20 has a source region 24, a body region 18, a gate region 26, a drain region 28, and a surface 22 which supports source electrode 30 and drain electrode 34. The drain region 28 includes a drain contact region 14 and tub wraparound 36 and is surrounded by oxide tub isolation 16. The semiconductor may be n-type or p-type and may be made of silicon or any III-V or II-VI semiconductor compound. First insulator 54 is supported by surface 22 and it defines apertures for source electrode 30 and drain electrode 34. A gate electrode 32, located above gate region 26, is supported by upper surface 56 of first insulator 54. A sensor 40 is supported by first upper surface 56 of first insulator 54 and the sensor is located above drain region 28 which includes drain contact region 14 and tub wraparound 16. The sensor and the source, gate, and drain electrodes are all electrically insulated from each other.

Figure 1B:
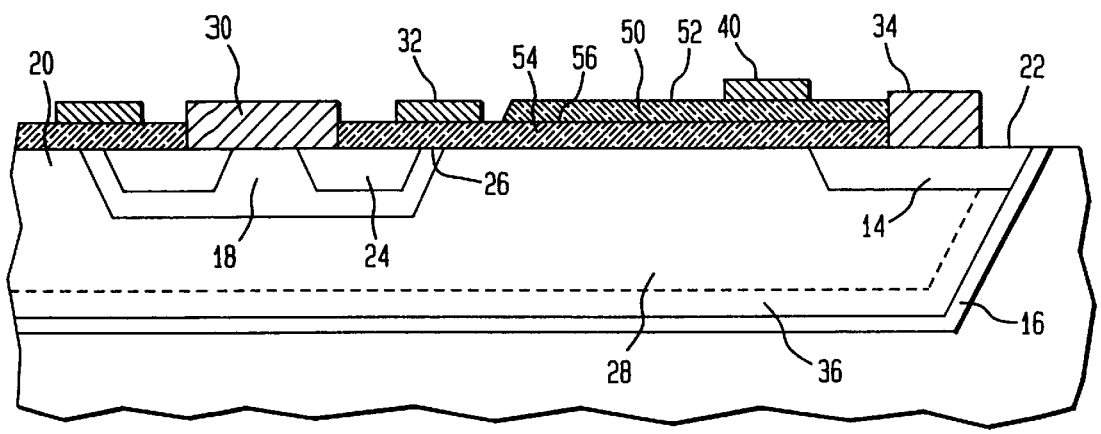

In FIG. 1B, there is shown semiconductor structure 150 wherein a second insulator 50 is supported by first upper surface 56. Sensor 40 is supported by second upper surface 52 and may be located anywhere between the gate and drain electrodes.

According to one embodiment, the semiconductor is silicon, regions of which are appropriately doped with impurities to define a source, a gate, and a drain beneath their corresponding electrodes. The doping is achieved by diffusion or ion implantation which may be followed by an anneal. These processing steps are well known in the art of semiconductor processing. First insulator 54 is typically thermally grown silicon dioxide because it has excellent dielectric properties and its thickness can be very well controlled. Typical thicknesses for the first insulator range from 200 to 1000 angstroms. The second insulator is usually deposited by chemical vapor deposition.

In an alternative processing technology, a thick oxide may be thermally grown, etched away in the gate region, and a gate oxide grown over the gate. The sequence of growing or depositing the second insulator in no way affects the operation of the sensor.

The source, gate, and drain electrodes may be any refractory metal silicide used in semiconductor processing to withstand high temperature processing such as, but not limited to, titanium silicide or tungsten silicide and others in Group IVB to Group VIB in the periodic table of elements. The electrodes may also be doped polysilicon which is doped with impurities which accept electrons (Group IIIA) or donate electrons (Group VA). The electrodes may also be a metal. These three electrodes, whose thicknesses are typically about 0.5 microns, cooperating with the doped silicon regions beneath them, form a well-known MOS transistor.

In applications where many transistors are crowded on a substrate, or where increased power is dissipated by a transistor, the increased temperature of semiconductor structure 100 may cause levels of unsatisfactory circuit performance or physical damage to the structure. These effects can be avoided by placing a sensor near the source and/or drain electrodes. The sensor may be comprised of a metal, a refractory metal silicide, or doped polysilicon. All these materials are compatible with, and well known in semiconductor processing, and have been referred to in the discussion of electrode materials above. Each of these materials also has a characteristic temperature coefficient of resistivity, so that the resistance per unit length of the material changes with temperature.

For example, a sensor may be formed by doping polysilicon with boron to give a sheet resistance of about 20,000 ohms per square, having in its length a sufficient number of squares to provide the required resistance to be coupled into a temperature sensing and limiting circuit.

Polysilicon resistors have been fabricated with temperature coefficients of resistivity as large as $-0.4\%/\epsilon C$., which makes them good temperature sensing devices. In this example, a doped polysilicon resistor would be 0.5 microns thick, 10 microns wide, and 50 microns long to achieve a total resistance of 100,000 ohms. The width of the sensor is limited only by the ability to define it lithographically, and its length should be less than the total width of the transistor to keep it within the hottest part of the semiconductor structure. The sensor's resistance values could range from as low as 1 ohm using metal to as high as 500,000 ohms using doped polysilicon.

Where the semiconductor is silicon, the insulator is usually an oxide or a nitride, and most commonly is silicon dioxide which is deposited by chemical vapor deposition and etched with well known methods to provide apertures.

Figure 2:
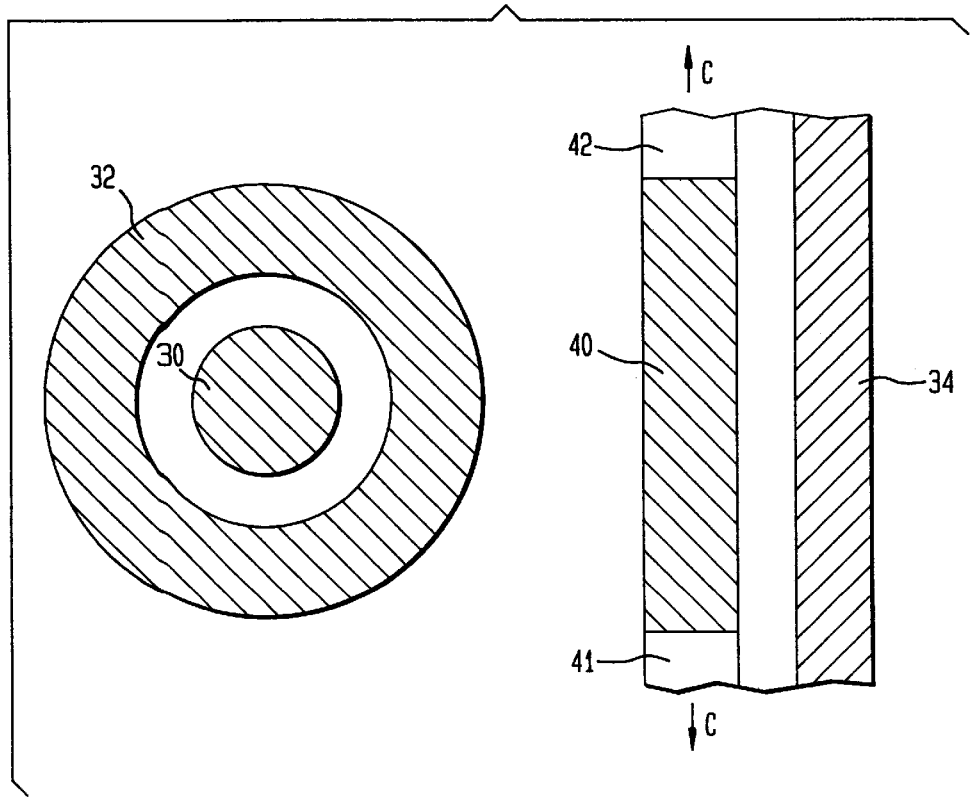
FIG. 2 is a partial top view of the embodiments shown in FIGS. 1[A] and 1[B]

Referring now to FIG. 2, there is shown a partial top view of semiconductor structure 150. The elements have the same numbers and perform the same function as in FIG. 1. The only additional elements shown are first conductor 41 and second conductor 42 which connect to each end of sensor 40 and lead to temperature sensing circuitry denoted by C—C.

Figure 3:
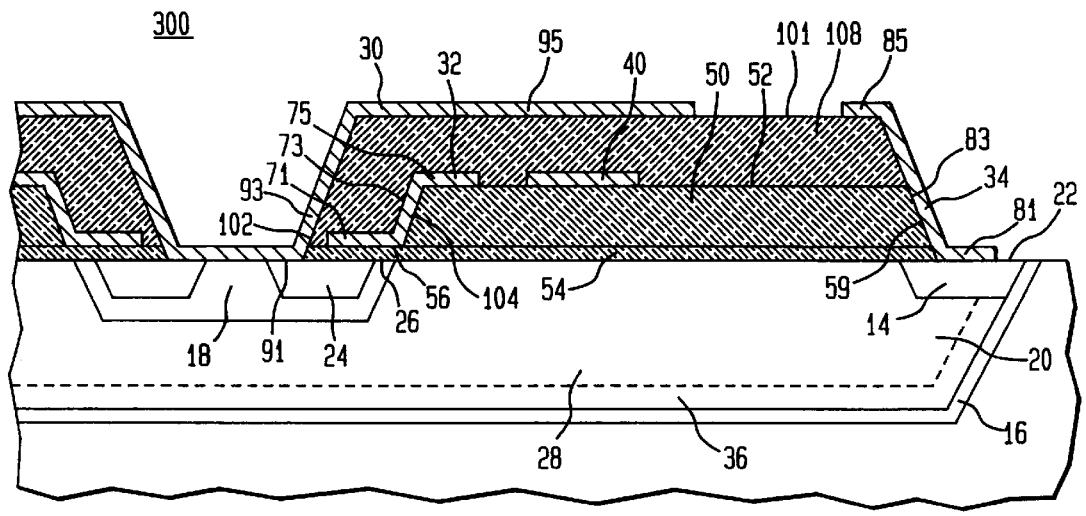
FIG. 3 is a sectional view of another embodiment.

Referring now to FIG. 3, there is shown semiconductor structure 300, in accordance with another embodiment of the invention, which comprises semiconductor 20 having a source region 24, a gate region 26, a drain region 28 which includes drain contact region 14, and a surface 22 which supports first insulator 54 having an upper surface 56 and second insulator 50 having second upper surface 52. First insulator 54 defines apertures for contacts to the source and drain, covers the gate region in semiconductor 20, and for a power transistor its thickness ranges from about 200 to 1000 angstroms. Second insulator 50 is a thicker insulator and may range from about 0.5 to 2 microns in thickness. It covers portions of the drain region.

Gate electrode 32 is supported in part by upper surface 56 of first insulator 54 and in part by second upper surface 52 of second insulator 50. The transition between insulators 50 and 54 is graded enough to allow gate electrode 32 to follow the transition. The gate electrode therefore has three sections: a gate section 71 supported by first insulator 54, a transitional section 73 supported by transition 104 between second insulator 50 and first insulator 54, and an interconnect section 75 which is supported by second upper surface 52.

Sensor 40 is supported by second upper surface 52. The aforementioned elements: insulator 54, gate electrode 32, insulator 50, and sensor 40 are all covered with third insulator 108 which is typically a phosphorous-doped glass, the thickness of which may range from about 0.5 to 2 microns.

Drain electrode 34 is comprised of three sections: a drain contact section 81 which is supported by surface 22 and which makes electrical contact with a drain region beneath it in semiconductor 20, a transitional section 83 which is supported by a transition 59 made by insulators 50, 54, and 108 between third upper surface 101 and surface 22, and a shield section 85 which is supported by third upper surface 101.

Source electrode 30 is comprised of three sections: a source contact section 91 which is supported by surface 22 and which makes electrical contact with a source region 24 and body region 18 beneath it in semiconductor 20, a transitional section 93 which is supported by transition 102 made by third insulator 108 as it rises from upper surface 56 to third upper surface 101 of third insulator 108, and shield section 95 which is supported by third upper surface 101. The functions and materials from which sensor 40 and the gate, source, and drain electrodes are made has been described within the discussion concerning FIG. 1 and are also applicable here as well.

In the operation of a power transistor, the drain electrode may experience potential changes of several hundred volts. In an MOS structure, the gate electrode is relatively close to the drain electrode, so a strong electric field exists between them along surface 22 of the semiconductor. The purpose of shield section 95 of the source electrode is to shield the gate electrode and gate region in the semiconductor from the field created by the potential at the drain electrode.

Sensor 40 is located between the gate and drain electrodes, and under shield section 95 to protect it from the potential swings at the drain electrode. The potential of the sensor is held near the potential of the source by the detection circuitry. As discussed previously, the transistors in an integrated circuit are isolated from neighboring devices by junctions or oxide isolation. This embodiment of the invention utilizes oxide tub isolation 16 as shown in FIG. 3. This isolation is nominally silicon oxide and has a thickness of 0.5 to 4 microns.

Figure 4:
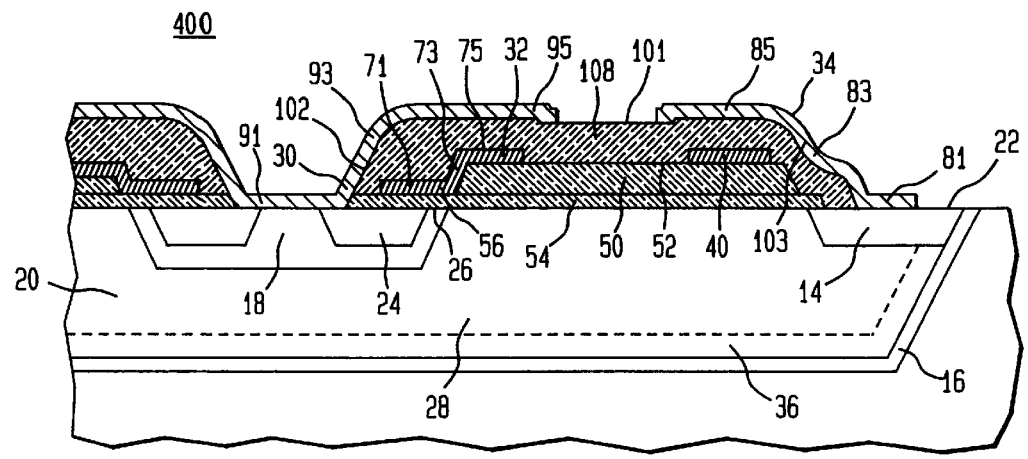
FIG. 4 is a sectional view of yet another embodiment.

Referring now to FIG. 4, there is shown semiconductor structure 400, yet another embodiment of the invention, in which sensor 40 is located beneath, but insulated from the drain electrode. Transition section 83 of the drain electrode is supported by transition section 103 of insulator 108. Otherwise the elements bear the same numbers and serve the same functions as described in the description of FIG. 3.

Figure 5A:
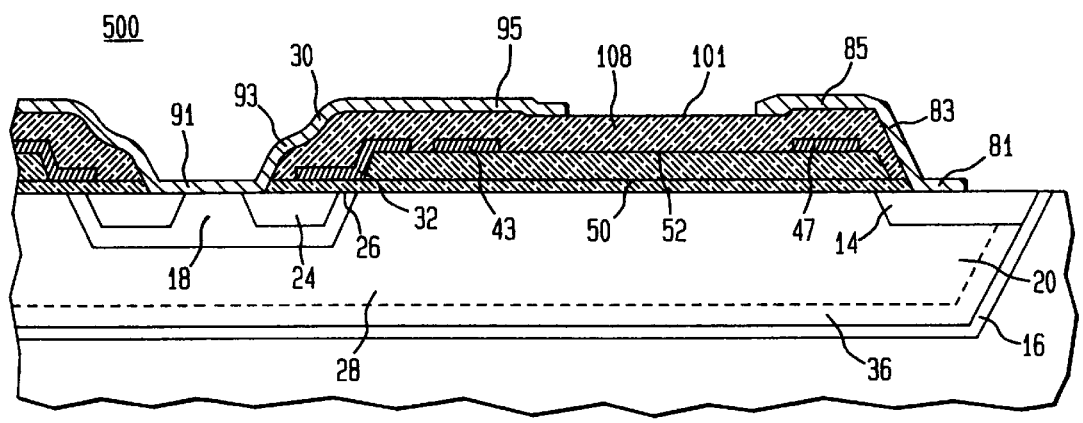
FIG. 5 is a sectional (5A) and top (5B) view of still another embodiment of the invention.
Figure 5B:
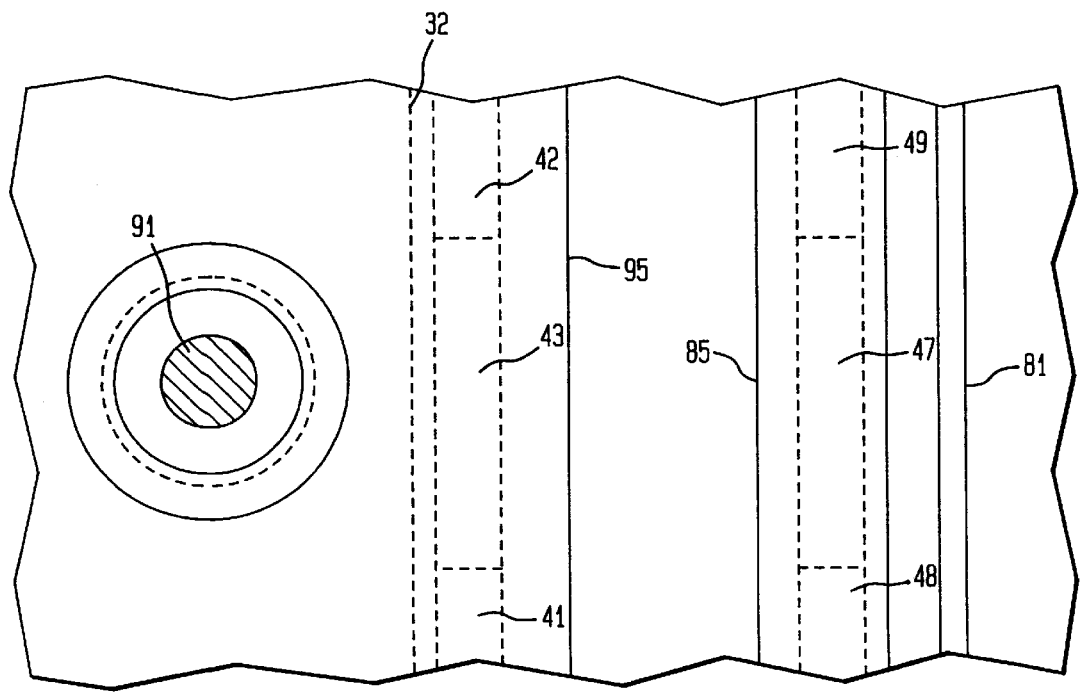

Referring now to FIG. 5, there is shown semiconductor structure 500, still another embodiment of the invention, in which two sensors are employed. A first sensor 43 being located beneath, but insulated from, shield section 95 of the source electrode; and a second sensor 47 being located beneath, but insulated from, shield section 85 of the drain electrode. Otherwise the elements bear the same numbers and serve the same functions as described in FIG. 4. In the embodiment illustrated in FIGS. 5[A] and 5[B], the resistance change with temperature of sensors 43 and 47 are monitored by temperature sensing circuitry via conductors 41 and 42 which connect to the ends of sensor 43 and conductors 48 and 49 which connect to the ends of sensor 47.

The advantage of semiconductor structure 500 is the ability to measure the difference of the resistance changes between sensors 43 and 47 which provides the ability to measure the thermal gradient within the dissipating transistor structure. This can greatly enhance the speed with which a control circuit can perform its functions.

Figure 6:
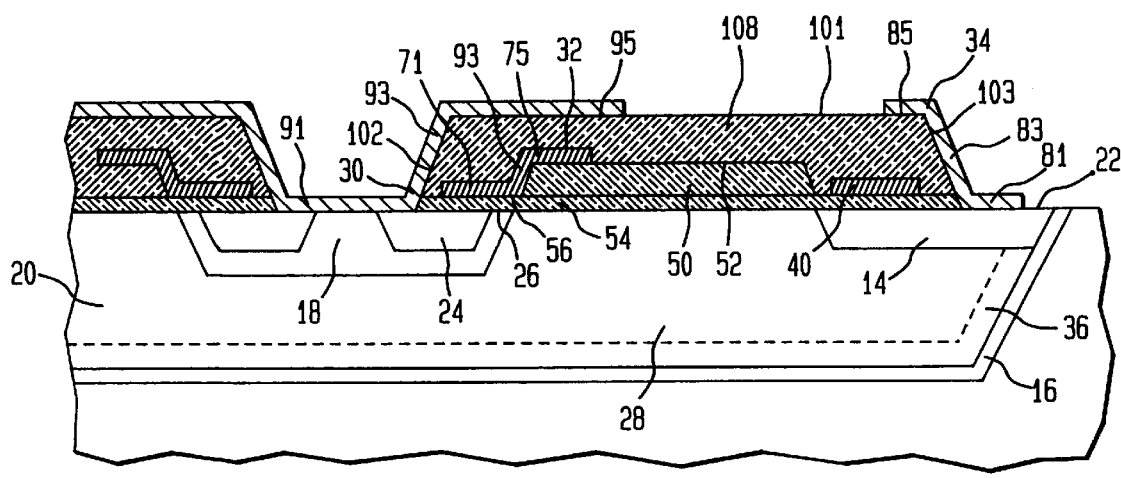
FIG. 6 is a sectional view of a further embodiment of the invention.

Referring now to FIG. 6, there is shown semiconductor structure 600, in accordance with a further embodiment of the invention. The elements have the same numbers and perform the same functions as those which have been given in the description of FIG. 3. Semiconductor structure 600 differs from semiconductor structure 300 in that sensor 40 is supported by upper surface 56 of first insulator 54 and it is located above drain contact region 14.

Figure 7A:
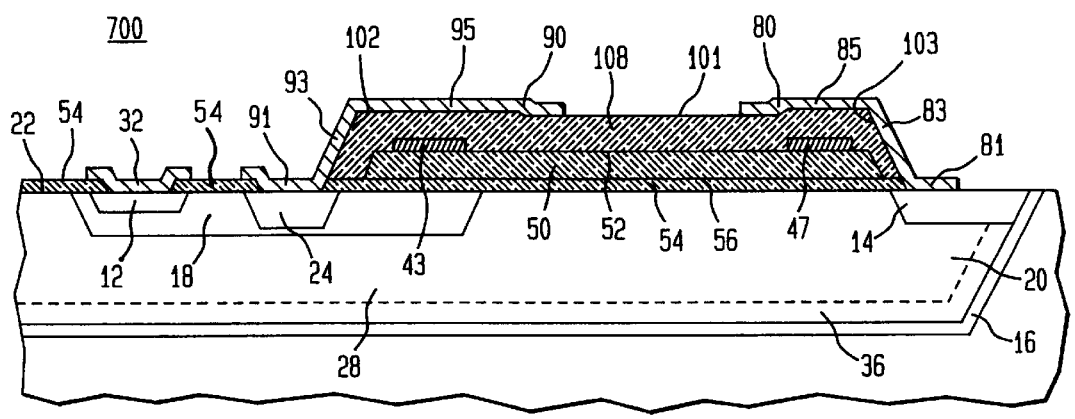
FIG. 7 is a sectional view (7A) and top (7B) view of yet a further embodiment of the invention.
Figure 7B:
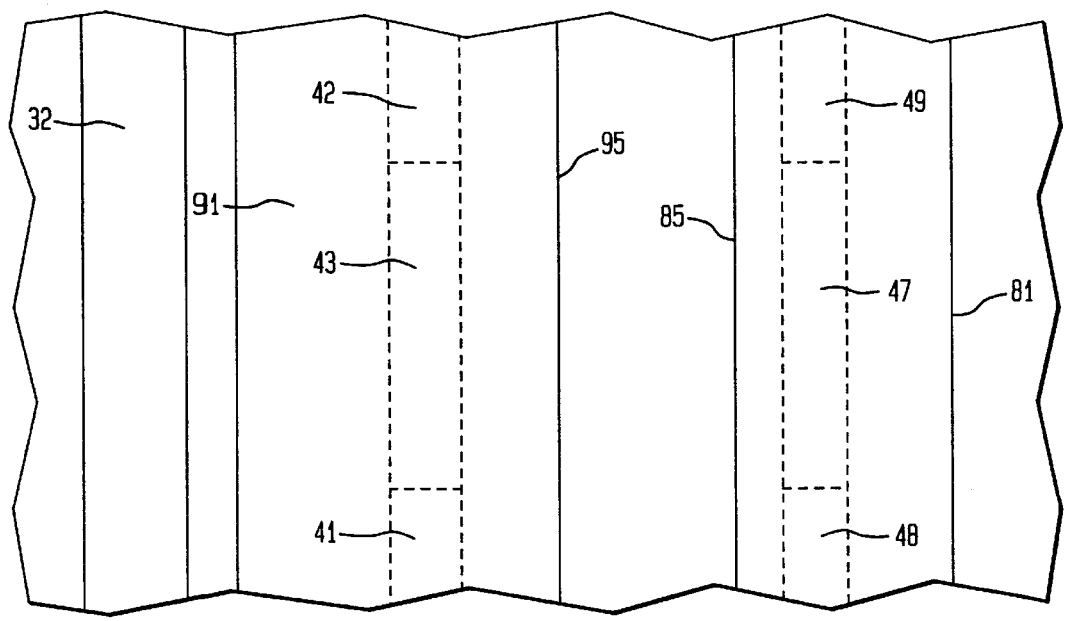

Referring now to FIGS. 7[A] and 7[B], there is shown semiconductor structure 700, in accordance with yet a further embodiment of the invention, which incorporates at least one sensor within a bipolar structure. Base electrode 32 is supported by surface 22 of bipolar semiconductor 20 and it makes electrical contact with base region 18, which includes base contact region 12, through an aperture in first insulator 54. Emitter region 24 is formed within the base region. Collector region 28, which includes collector contact region 14, is the tub region around the base region. The various regions, including tub wraparound 36 and oxide tub isolation 16, are formed by methods which are well known in the art. Second insulator 50 having second upper surface 52 is supported by the first insulator over the surface of the collector region. A first sensor 43 is supported by second upper surface 52 above the base region close to the base-collector junction. A second sensor 47 is supported by second upper surface 52 near where contact is made to the collector region. Third insulator 108 having third upper surface 101 and transition sections 102 and 103 covers the second insulator and the sensors.

Collector electrode 80 is comprised of collector contact section 81 which is supported by and makes electrical contact with collector contact region 14 and with collector region 28 through an aperture in the first insulator, transition section 83 which is supported by a transition section 103 of the third insulator, and collector shield section 85 which is supported by third upper surface 101. The collector shield section extends toward the base electrode a distance sufficient to overlay the second sensor.

Emitter electrode 90 is comprised of emitter contact section 91 which is supported by and which makes electrical contact with the emitter region through an aperture in first insulator 54, transition section 93 which is supported by the other transition section of third insulator 102, and emitter shield section 95 which is supported by third upper surface 101. The emitter shield section extends toward the collector electrode a distance sufficient to overlay the first sensor. The functions, operations, and materials of construction of the sensors and the electrodes are the same as has been described in the discussion of the MOS structures of the previous embodiments.

Figure 8:
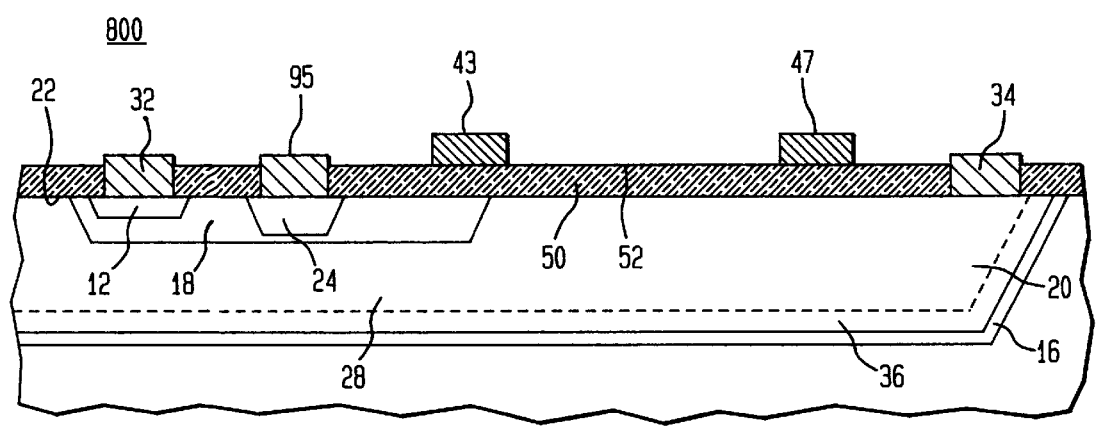
FIG. 8 is a sectional view of a yet another embodiment of the invention.

Referring now to FIG. 8, there is shown semiconductor structure 800 in accordance with still a further embodiment of the invention which incorporates a single insulator 50 having an upper surface 52. Sensors 43 and 47 are supported by the upper surface. Apertures in the insulator permit base electrode 32 to make contact with contact region 12 and base region 18, emitter electrode 95 to make contact with emitter region 24, and collector electrode 34 to make contact with collector region 28 which includes tub wraparound 36. Oxide isolation 16 insulates the structure from its neighbors. The functions, operations, and materials of construction of the sensors and the electrodes are the same as has been described in the discussion of the MOS structures of the previous embodiments.

Changes and modifications in the specifically described embodiments can be carried out without departing from the scope of the invention. In particular, the invention may be used in many types of integrated circuit technologies, such as, junction isolated structures. The routing and geometry of the elements in the top views may be altered to meet design requirements and insulators such as, but not limited to, silicon nitride may be substituted for various insulating layers. Additional insulating layers may also be applied over the structures described to provide additional protection in assembly.

We claim:

1. A semiconductor structure comprising:
   a semiconductor comprising a surface, a gate on the surface, and source and drain regions which are beneath the surface, the gate region being located between the source and drain regions;

a first insulator, having an upper surface, supported by the surface of the semiconductor, defining apertures over the source and drain regions;

a source electrode, supported by the surface, making electrical contact to the source region;

a drain electrode, supported by the surface, making electrical contact to the drain region;

a gate electrode, supported by the upper surface of the first insulator, located over the gate region; and a sensor, having two ends, directly supported by the upper surface of the first insulator and located proximate to a region selected from the group of the source electrode and the drain electrode of the semiconductor potentially subject to thermal stress.

2. The semiconductor structure of claim 1 further comprising a second insulator; the second insulator having a second upper surface, supported by the upper surface of the first insulator, said second insulator being located above the drain region between the gate electrode and the drain electrode.

3. The semiconductor structure of claim 2 further comprising a first conductor connected to one end of the sensor and a second conductor connected to the other end of the sensor, said conductors being adapted to connect to a circuit.

4. The semiconductor structure of claim 1 wherein the sensor is a temperature sensing resistor constructed of doped polysilicon.

5. The semiconductor structure of claim 1 wherein the sensor is located over a drain contact region.

6. A semiconductor structure comprising:

a semiconductor comprising a surface, a gate on the surface, and source and drain regions which are beneath the surface, the gate region being located between the source and drain regions;

a first insulator, having an upper surface, supported by the surface of the semiconductor, defining apertures over the source and drain regions;

a source electrode, supported by the surface, making electrical contact to the source region;

a drain electrode, supported by the surface, making electrical contact to the drain region;

a gate electrode, supported by the upper surface of the first insulator, located over the gate region;

a second insulator, having a second upper surface, supported by the upper surface of the first insulator, being located between the gate electrode and the drain electrode;

a polysilicon resistor, having a first end and a second end, supported by the second upper surface of the second insulator and located proximate to a region selected from the group of the source electrode and the drain electrode of the semiconductor potentially subject to thermal stress;

a first conductor, supported by the second upper surface of the second insulator, being connected to the first end of the resistor; and a second conductor, supported by the second upper surface of the second insulator, being connected to the second end of the resistor;

wherein said conductors are adapted to connect to a temperature sensing circuit that is operable to process resistive variations into respective currents and voltages related to the temperature of the polysilicon resistor.

7. The semiconductor structure of claim 6 further comprising a third insulator, having a third upper surface and two transition sections, covering the gate electrode, the sensor, and the first and second insulators.

8. The semiconductor structure of claim 7 wherein the source electrode includes a source contact section supported by and making contact with the source region, a transition section supported by a transition section of the third insulator, and a shield section supported by the third surface of the third insulator.

9. The semiconductor structure of claim 8 wherein the shield section of the source electrode extends in the direction of the drain electrode a distance sufficient to cover the gate electrode.

10. The semiconductor structure of claim 8 wherein the shield section of the source electrode extends in the direction of the drain electrode a distance sufficient to cover the gate electrode and the sensor.

11. The semiconductor structure of claim 8 whereina shield section of the drain electrode extends in the direction of the source electrode a distance sufficient to cover the sensor.

12. The semiconductor structure of claim 8 wherein a first sensor is located adjacent to the gate electrode and a shield section of the source electrode extends toward the drain electrode a distance sufficient to cover the first sensor, and a second sensor is located adjacent to a transition section of the drain electrode and a shield section of the drain electrode extends toward the source electrode a distance sufficient to cover the second sensor.

13. The semiconductor structure of claim 7 wherein the drain electrode further includes a drain contact section supported by and making contact with the drain contact region, a transition section supported by transition sections of the second and third insulators, and a shield section supported by the third upper surfaces of the third insulator.

14. The semiconductor structure of claim 6 further comprising a first conductor connected to one end of the sensor and a second conductor connected to the other end of the sensor, said conductors being adapted to connect to a circuit.

15. The semiconductor structure of claim 6 wherein the sensor is a doped polysilicon resistor.

16. The semiconductor structure of claim 6 wherein the gate electrode further includes a gate section supported by the upper surface of the first insulator, a transition section supported by a transition section of the second insulator, and an interconnect section supported by the second upper surface of the second insulator.

17. A semiconductor structure comprising:

a semiconductor comprising a surface and emitter, base, and collector regions, the base region being located between the emitter and collector regions;

a first insulator, having an upper surface, defining apertures above the emitter, base, and collector regions, supported by the semiconductor surface;

a second insulator, having a second upper surface, supported by the upper surface of the first insulator;

at least one sensor, having two ends, supported by the second upper surface of the second insulator;

a third insulator, having a third upper surface and two transition sections, covering at least one sensor and the first and second insulators;

an emitter electrode comprising an emitter contact section supported by and making contact with the emitter region, a transition section supported by a transition sections of the first and third insulators, and a shield section located above at least one sensor supported by the third upper surface of the third insulator;

a base electrode supported by and making contact with the base region; and a collector electrode comprising a collector contact section supported by and making contact with the collector region, a transition section supported by transition sections of the first and third insulators, and a shield section located above at least one sensor supported by the third upper surface of the third insulator.

18. The semiconductor structure of claim 17 further comprising a first conductor connected to one end of the sensor and a second conductor connected to the other end of the sensor, said conductors being adapted to connect to a circuit.

19. The semiconductor structure of claim 17 wherein the sensor is a doped polysilicon resistor.

20. The semiconductor structure of claim 17 wherein the shield section of the emitter electrode extends in the direction of the collector electrode a distance sufficient to cover the sensor.

21. The semiconductor structure of claim 17 wherein the shield section of the collector electrode extends in the direction of the emitter electrode a distance sufficient to cover the sensor.

22. The semiconductor structure of claim 17 wherein a first sensor is located adjacent to the emitter contact section and the shield section of the emitter electrode extends toward the collector electrode a distance sufficient to cover the first sensor, and a second sensor is located adjacent to the collector contact section and the shield section of the collector electrode extends toward the emitter electrode a distance sufficient to cover the second sensor.

* * * * *